United States Patent [19]

Dotson, Jr.

[11] 3,754,236

[45] Aug. 21, 1973

[54] DIGITAL TO ANALOG CONVERSION APPARATUS

[75] Inventor: William P. Dotson, Jr., Dickinson, Tex.

[73] Assignee: The United States of America as represented by the Administrator of the National Aeronautics and Space Administration, Washington, D.C.

[22] Filed: Oct. 13, 1971

[21] Appl. No.: 188,927

[52] U.S. Cl. ............... 340/347 DA, 235/152 IE

[51] Int. Cl. ............................................ H03k 13/02

[58] Field of Search .............................. 340/347 DA

[56] References Cited

UNITED STATES PATENTS

| | | | |
|---|---|---|---|
| 3,634,667 | 1/1972 | Okamoto | 235/152 IE |
| 3,644,723 | 2/1972 | Rosener | 235/152 IE |
| 3,564,535 | 2/1971 | Ward | 340/347 |

OTHER PUBLICATIONS

Johnson, Interpolation – A Link Between Programmed Points and Smooth Curves.

*Primary Examiner*—Maynard R. Wilbur
*Assistant Examiner*—Jeremiah Glassman
*Attorney*—Marvin J. Marnock, John R. Manning et al.

[57] ABSTRACT

A digital to analog converter which improves the accuracy of reconstruction of a sampled analog signal without requiring that the sampling rate of the original signal be increased to obtain such accuracy.

2 Claims, 7 Drawing Figures

DIGITAL TO ANALOG CONVERSION APPARATUS

ORIGIN OF THE INVENTION

The invention described herein was made by an employee of the United States Government and may be manufactured and used by or for the Government of the United States of America for governmental purposes without the payment of any royalties thereon or therefor.

BACKGROUND OF THE INVENTION

1. Field of the Invention

The present invention relates to apparatus and methods for reconstructing an analog signal from a digital signal.

2. Description of Prior Art

When it was required or desirable in prior art digital to analog conversion systems to increase the accuracy of an analog signal during conversion of a digital signal, several prior art techniques were used.

A first technique generated or formed a predicted analog output signal corresponding to a predicted value for the output signal during the conversion interval or cycle. The predicted signal value was compared with the output signal formed during the conversion interval, and a correction signal was formed corresponding to the difference between the signals. The correction signal was then used to adjust the predicted value of the output signal during the next conversion interval. With certain signals, such as rapidly-changing signals fluctuating between output levels during conversion intervals, relatively severe and undesirable transients resulted.

A second technique used to increase the accuracy of reconstruction of the analog signal was to increase the sampling rate of the original signal during conversion thereof into digital code or format. However, increasing the sampling rate of the original signal required an increased signal bandwidth for transmission of the increased samples within the same sampling interval, which was undesirable due to transmission bandwidth limitations and due to increased complexity and cost of coding, transmission, reception, and decoding equipment.

SUMMARY OF INVENTION

Briefly, the present invention provides a new and improved apparatus and method for accurate reconstruction of an output analog signal from a digital signal wherein the digital signal is converted into successive amplitude samples and the output analog signal is formed by interpolating between successive amplitude samples to minimize transitions between output amplitude samples and accurately reconstruct the output analog signal.

The interpolation is performed in accordance with an $n^{th}$ order polynomial function, wherein n is an integer, by integrating to solve an $n^{th}$ order differential equation. Initial conditions for solving the $n^{th}$ order differential equation by integrating are computed based upon $n + 1$ successive amplitude samples from converted digital signals. The initial conditions computed may be adjusted in accordance with the accuracy of signal reconstruction required, obviating the necessity of increasing signal sampling rate to increase reconstruction accuracy.

The output analog signal formed by the interpolation is an $n^{th}$ order polynomial function $y(t)$ of the time interval t between successive amplitude samples, with each term in the polynomial function $y(t)$ including a predetermined constant determined by the initial conditions.

DESCRIPTION OF THE PREFERRED EMBODIMENT

Figures 1, 2:
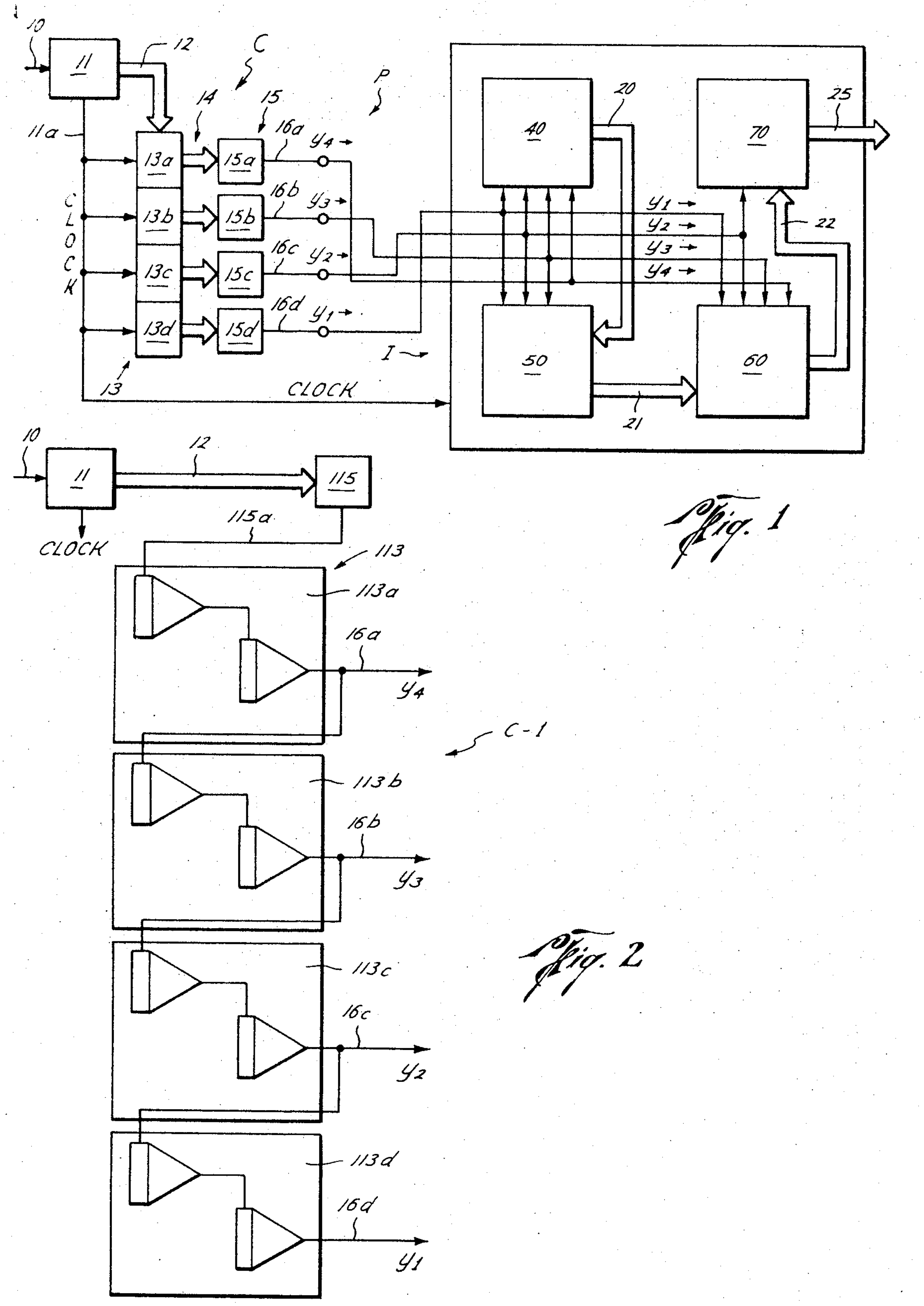
FIG. 1 is a functional block diagram of the apparatus of the present invention.
FIG. 2 is a schematic diagram of an alternative circuit arrangement for use in the apparatus of FIG. 1.
Figure 3:
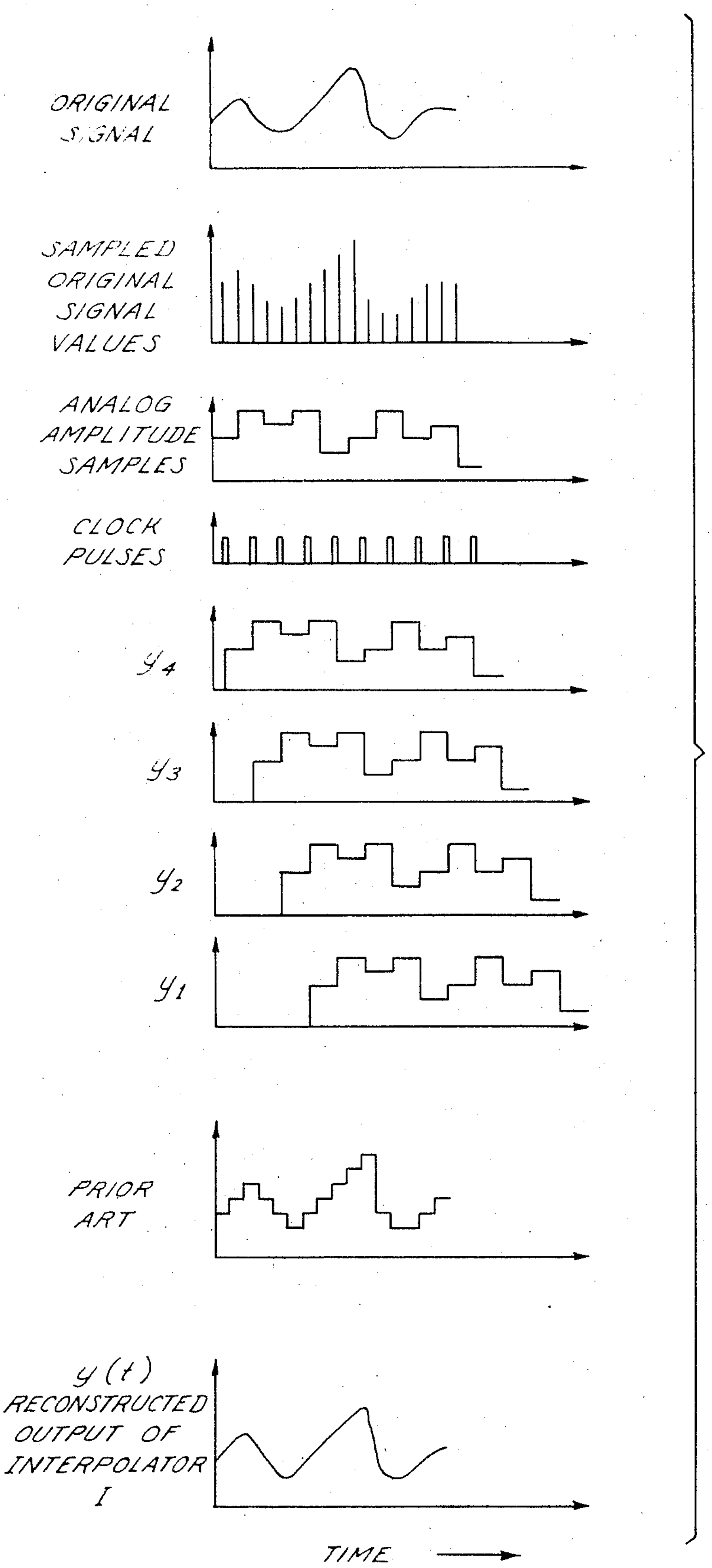
FIG. 3 is a waveform diagram illustrating amplitude waveforms in the apparatus of FIG. 1 as a function of time.

In the drawings, the letter P designates generally the apparatus of the present invention which accurately reconstructs an output analog signal from a digital signal by converting the digital signal into successive amplitude samples and interpolating between successive amplitude samples to form the output analog signal thereby reducing transitions between amplitude samples and accurately reconstructing the output analog signal. The digital signal may be any suitable digital information or data used in data transmission, storage, telemetry, computing, and the like.

The apparatus P includes a converter C (FIG. 1) which converts the digital signal into successive amplitude samples as such digital signal is presented to the apparatus P. An interpolator I (FIG. 1) forms the output analog signal for intermediate values of the output analog signal between the successive amplitude samples presented to the interpolator I by the converter C. The interpolation is based upon the successive amplitude samples in the converter C and thereby minimizes the transitions between successive amplitude samples and accurately reconstructs the analog output signal.

With the present invention, it has been determined that interpolation between successive amplitude samples in accordance with a polynomial mathematical function minimizes the transitions between successive amplitude samples and provides an accurate reconstruction of the output analog signal. A preferred embodiment of the present invention interpolates between the successive amplitude samples from the converter C in accordance with a third order polynomial mathematical function of the general form:

$$y(t) = At^3 + Bt^2 + Ct + D \qquad (1)$$

However, it should be understood that the interpolation by the apparatus P may be performed in accordance with other polynomial mathematical functions, if desired.

The interpolator I forms the output analog signal in accordance with a polynomial mathematical function of order n wherein n is an integer, in the preferred embodiment 3 (Equation (1)), by integrating, as will be set forth hereinbelow, to solve an $n^{th}$ order differential equation and form the $n^{th}$ order polynomial function. In order for the interpolator I to form the output signal representing the solution of such differential equation, initial condition signal amplitudes are formed therein, as will be set forth hereinbelow, based upon $n + 1$ successive amplitude samples from the converter C.

In order to more clearly understand the operation of the apparatus P of the present invention in solving the third order differential equation, a brief mathematical analysis of the operation of the apparatus P will be set forth.

At four spaced intervals of time: –T, O, T, and 2T, the output analog signal $y(t)$ has values in accordance with the following equations in accordance with the polynomial function of Equation (1):

At time –T, $y_1 = -AT^3 + BT^2 - CT + D$ (2)

At time 0, $y_2 = D$ (3)

At time T, $y_3 = AT^3 + BT^2 + CT + D$ (4)

At time 2T, $y_4 = 8AT^3 + 4BT^2 + 2CT + D$ (5)

Using conventional algebra techniques, and solving equations (2) through (5) for the coefficients of the polynomial mathematical function of equation (1), the values of such coefficients are determined in terms of the amplitude samples as follows:

$$A = (-y_1 + 3y_2 - 3y_3 + y_4)/(6T^3) \quad (6)$$

$$B = (y_1 - 2y_2 + y_3)/(2T^2) \quad (7)$$

$$C = (-2y_1 - 3y_2 + 6y_3 - y_4)/(6T) \quad (8)$$

$$D = y_2 \quad (9)$$

Using conventional differential calculus techniques, the first, second, and third time derivatives of the polynomial mathematical function $y(t)$ are determined as follows:

$$y'(t) = 3At^2 + 2Bt + C \quad (10)$$

$$y''(t) = 6At + 2B \quad (11)$$

$$y'''(t) = 6A \quad (12)$$

with the values of A, B, C, and D being in accordance with equations (6) through (9), as has been previously set forth.

The apparatus P repetitively forms the output analog signal during each time interval from a time $t = 0$ to a time $t = T$, wherein T represents the time duration between successive amplitude samples from the converter C, interpolating between the amplitude samples at times $t = 0$ and $t = T$ in accordance with the third order polynomial function $4(t)$ of Equation (1). The interpolator I forms the output signal $4(t)$ for the time interval from $t = 0$ until $t = T$ based upon four successive amplitude samples at times –T, 0, T, and 2T by forming a signal representing the solution to the third order differential Equation (12).

In order for the interpolator I to perform the integration and form the output signal $y(t)$ representing the solution of the differential Equation (12), the initial condition signal amplitudes at the time $t = 0$, are determined from Equations (9) through (12):

$$y(0) = D \quad (13)$$

$$y'(0) = C \quad (14)$$

$$y''(0) = 2B \quad (15)$$

$$y'''(0) = 6A \quad (16)$$

The initial condition signals are formed in the interpolator I based upon the four successive amplitude samples from the converter C. The initial condition signals are processed by the interpolator I in forming the output analog signal $y(t)$ as will be more evident hereinbelow.

Considering the apparatus P more in detail (FIG. 1), the converter C receives an incoming serial digital data stream as indicated by an arrow 10 at a data preparation circuit 11 having therein a demultiplexer of the conventional and well-known type and a serial to parallel data converter, also of the conventional and well-known type. The demultiplexer portion of the data preparations circuit 11 demultiplexes the incoming signal data stream and retrieves the clock signal therefrom. The serial to parallel converter portion of the data preparation circuit 11 forms data words each composed of a plurality of digital bits which are to be converted in the converter C into successive output amplitude samples. The data words are furnished from the serial to parallel converter portion of the data preparation circuit 11, as indicated by an arrow 12, to a shift register 13.

The shift register 13 is of the conventional and well-known type and has four stages therein, 13*a*, 13*b*, 13*c*, and 13*d*, each having plural digital memory devices therein to receive and store the serial data word output of the data preparation circuit 11. The demultiplexer portion of the data preparation circuit 11 retrieves the clock or synchronization signal from the incoming serial data stream and furnishes a clock pulse, as indicated by an arrow 11*a*, to each of the four stages 13*a* through 13*d*, respectively, of the shift register 13 in order that the converter C operates in synchronism with the serial data stream. The clock pulses from the data preparation circuit 11 are further furnished to the interpolator I, as will be more evident hereinbelow. To preserve clarity in the drawings, the connections by which the clock pulses are fed to the interpolator I are not illustrated in FIG. 1.

The four stages 13*a* through 13*d* of the shift register 13 furnish the digital data words stored therein to a corresponding plurality of sample and hold and digital to analog converter stages 15*a*, 15*b*, 15*c*, and 15*d*, respectively. The digital to analog converter stages 15*a* through 15d include digital to analog converters of the conventional and well-known type and sample and hold circuitry of the conventional and well-known type which store the amplitude samples formed in the converter C and furnish the amplitude samples so formed over output conductors 16*a*, 16*b*, 16*c*, and 16*d* to the interpolator I.

For ease in understanding the operation of the interpolator I in forming the output analog signal in accordance with the polynomial mathematical function using the equations set forth hereinabove, the signals furnished over the conductors 16*a* through 16*d* have been assigned reference numerals $y_4$, $y_3$, $y_2$, and $y_1$, respectively, as is evident from the drawings (FIG. 1).

In an alternative converter C-1 (FIG. 2), like structure performing a like function to the converter C (FIG. 1) bears like reference numerals. The incoming serial data stream, indicated by the arrow 10, is furnished to the data preparation circuit 11 which extracts a clock signal and furnishes same over the conductor 11*a*, as has been previously set forth. The data words formed in the data preparation circuit 11 are furnished, as indicated by the arrow 12 to a digital to analog converter 115 of the conventional and well-knonw type. The converter 115 converts the digital data words representing the digital signal into successive amplitude samples and furnishes same over an output conductor 115*a* to an analog storage circuit 113 which stores the successive amplitude samples formed in the converter 115.

The analog storage circuit 113 includes four analog storage stages 113*a*, 113*b*, 113*c*, and 113*d*, each composed of a pair of sample and hold analog gates of the conventional and well-known type. The sample and hold gates in each of the analog storage stages 113*a* through 113*d*, respectively, are operated in synchronism with the serial data stream by means of the clock signal furnished over the output conductor 11*a*. In order to preserve clarity in the drawings, and in view of the conventional and well-known nature of the analog storage circuitry, the connection of the output conductor 11*a* to the analog storage circuit 113 is not illustrated in the drawings.

The analog storage stages 113*a* through 113*d* furnish the amplitude samples from the converter C-1 over the output conductor 16*a* through 16*d*, respectively, to the interpolator I in order that the output analog signal may be formed in the interpolator I in a manner to be set forth hereinbelow.

Figure 4:
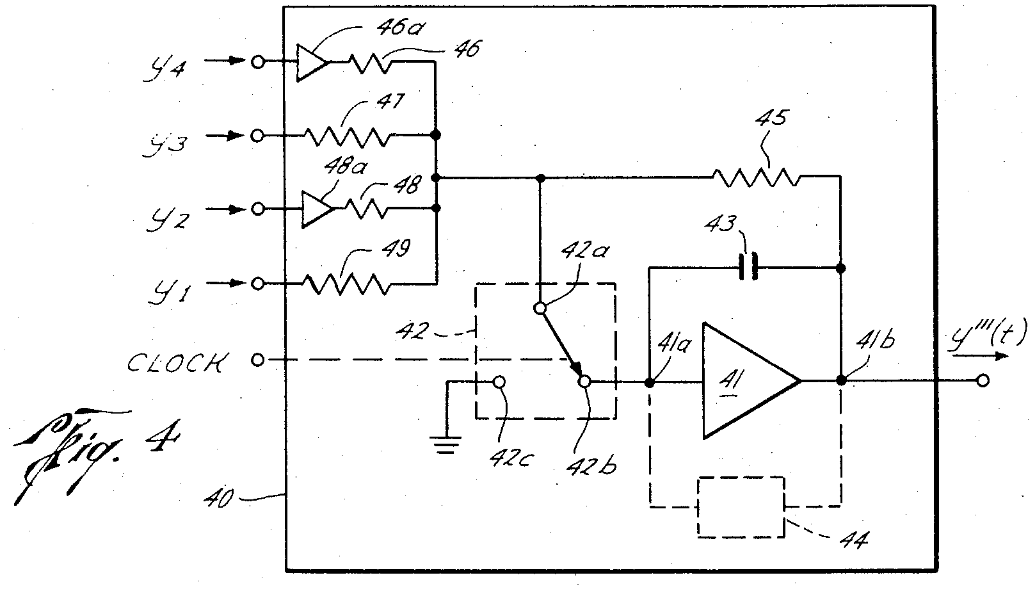
FIG. 4 is a schematic electrical circuit diagram of a portion of the apparatus of FIG. 1 having reference numeral 40 designating same.
Figure 5:
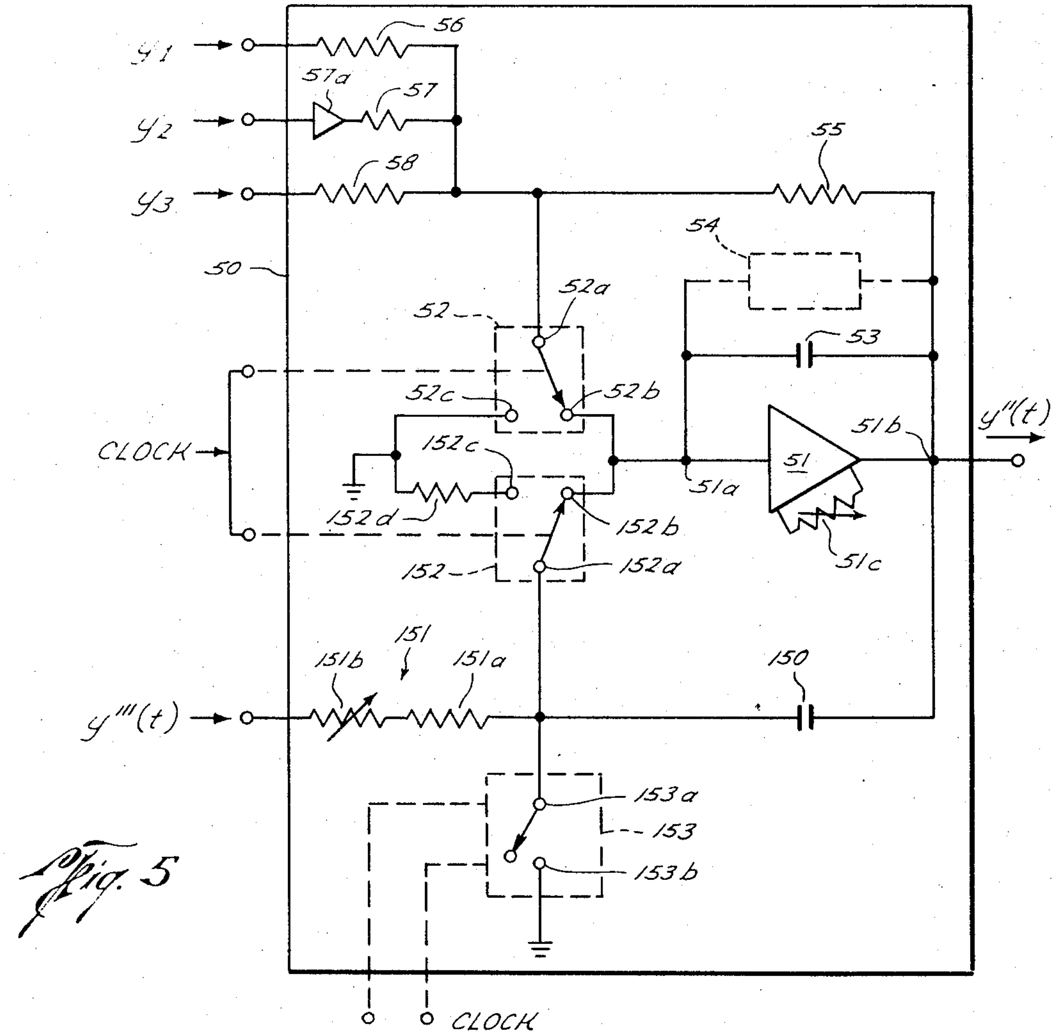
FIG. 5 is a schematic electrical circuit diagram of a portion of the apparatus of FIG. 1 having reference numeral 50 designating same.
Figure 6:
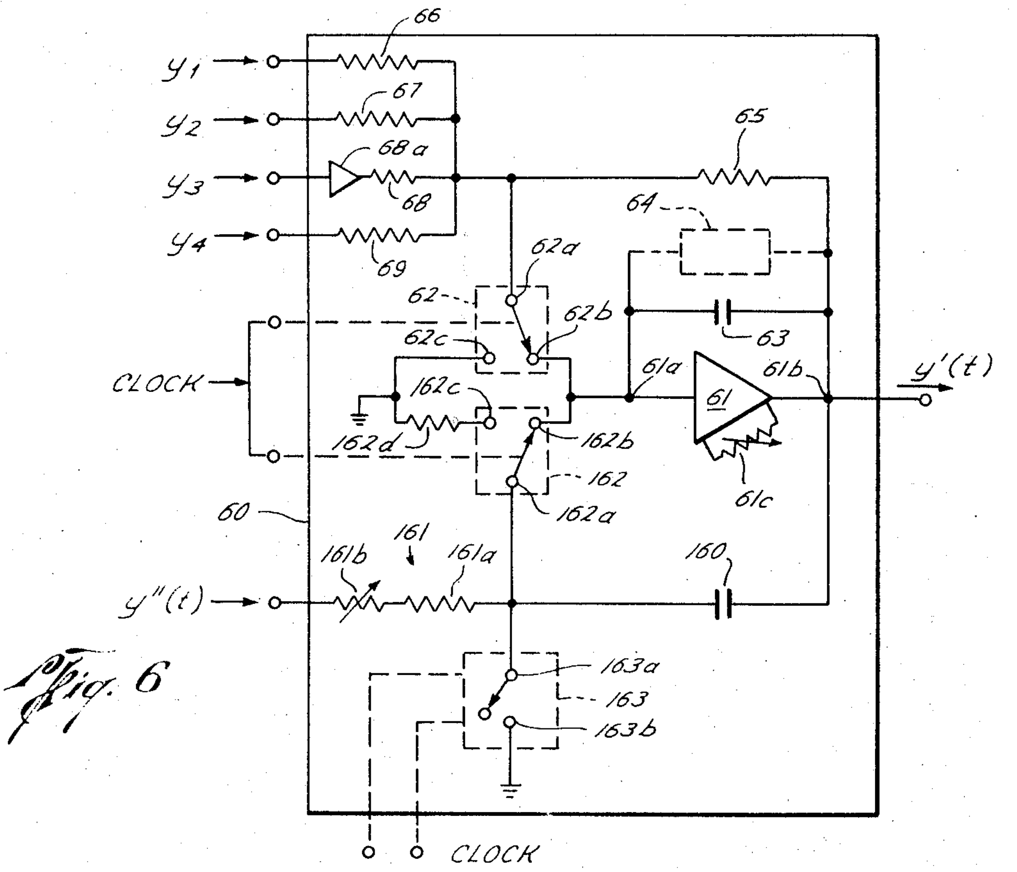
FIG. 6 is a schematic electrical circuit diagram of a portion of the apparatus of FIG. 1 having reference numeral 60 designating same.

Considering the interpolator I more in detail (FIGS. 1 and 4–7), an initial condition computing circuit 40 (FIGS. 1 and 4) receives the four successive amplitude samples from the converter C and forms an initial condition signal amplitude therein in accordance with Equations (6), (12), and (16). The initial condition amplitude signal formed in the initial condition circuit 40 is furnished as indicated by an arrow 20 (FIG. 1) to a first integrator circuit 50 (FIGS. 1 and 5).

The first integrator circuit 50 receives the initial condition output signal amplitude from the initial condition circuit 40 and further receives the amplitude samples $y_1$, $y_2$, and $y_3$ from the converter C in accordance with Equation (7) to form therein an initial condition signal amplitude in accordance with Equations (7) and (15). The initial condition signal amplitude so formed is processed in the first integrator 50 forming an output signal amplitude in accordance with Equation (11) by integrating during the time interval from time $t = 0$ until time $t = T$. The signal amplitude so formed in the first integrator 50 is furnished, as indicated by an arrow 21 (FIG. 1), to a second integrator circuit 60.

Figure 7:
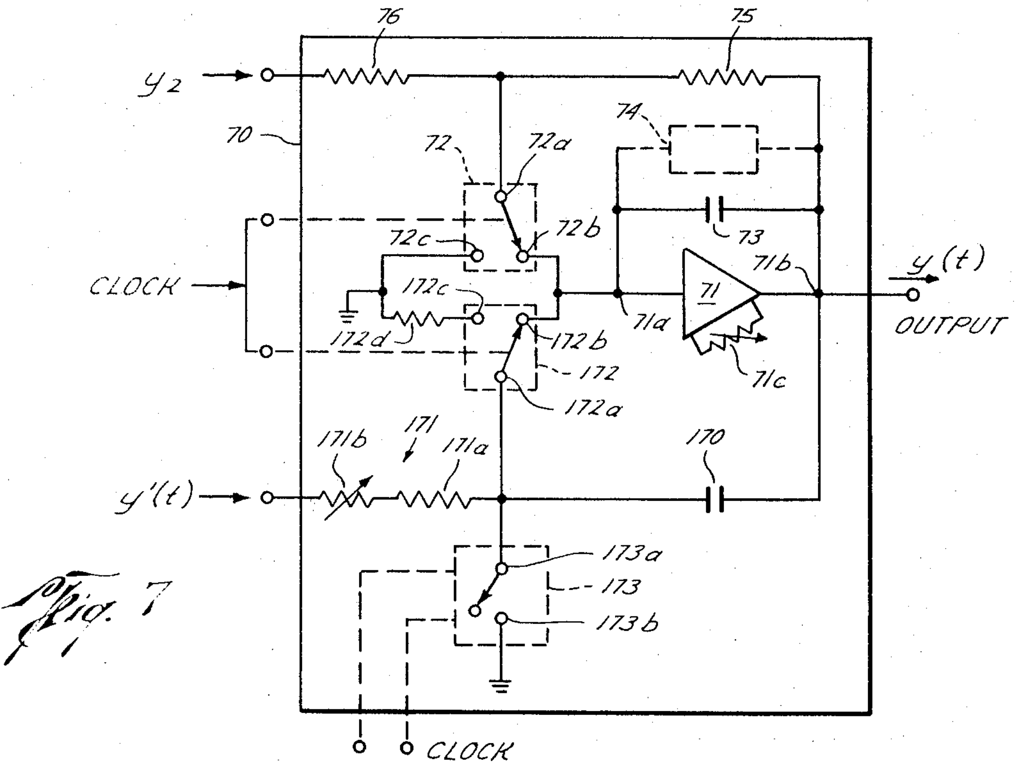
FIG. 7 is a schematic electrical circuit diagram of a portion of the apparatus of FIG. 1 having reference numeral 70 designating same.

The second integrator circuit 60 (FIGS. 1 and 6) receives the signal amplitude formed in the first integrator 50 and further receives the amplitude samples from the converter C to form an initial condition signal amplitude in accordance with Equations (8) and (14). The initial condition signal amplitude formed in the second integrator circuit 60 and the signal amplitude from the first integrator circuit 50 are processed in the second integrator circuit 60, as will be set forth hereinbelow, to form an output signal amplitude in accordance with Equation (10). The output signal amplitude so formed in the second integrator circuit 60 is furnished, as indicated by an arrow 22, to a third integrator circuit 70 (FIGS. 1 and 7).

The third integrator circuit 70 receives the output signal amplitude formed in the second integrator circuit 60 and further receives a signal amplitude $y_2$ from the converter C to form an initial condition signal amplitude therein in accordance with Equations (9) and (13). The third integrator 70 processes the initial condition signal amplitude so formed and the output signal from the second integrator circuit 60 to form therein the output signal amplitude in accordance with Equation (1) and provide such analog signal as indicated by an arrow 25. In this manner, the interpolator I integrates the output of the converter C to solve the $3^{rd}$ order differential Equation (12) and form the output signal therein during the time interval from time $t = 0$ until time $t = T$ between successive amplitude samples from the converter C.

The initial condition circuit 40 (FIG. 4) receives the output amplitude samples from the converter C and forms an output initial condition signal amplitude in accordance with Equations (6) and (12), as has been previously set forth. An operational amplifier 41, operated in a voltage summing configuration, receives input signals from the converter C at an input terminal 41*a* thereof. An electronic control switch 42, which may be any suitable analog electronic control switch, provides an electrically-conductive path for the signals from the converter C between an input terminal 42*a* and an output terminal 42*b* thereof in response to receipt of a clock pulse from the data preparation circuit 11 over the electrical conductor 11*a*, as has been previously set forth. Absence of the clock pulse causes the switch 42 to provide an electrical path to an electrical ground for the signal present at the input terminal 42*a* thereof through an output terminal 42*c*.

A holding capacitor 43 is electrically connected between an output terminal 41*b* and the input terminal 41*a* of the amplifier 41. The capacitor 43 assists in regulating the gain and accuracy of the amplifier 41.

A clamp circuit 44, illustrated in phantom in the drawings, may be connected between the output terminal 41*b* and the input terminal 41*a* of the amplifier 41 in order to limit the output of the amplifier 41, if desired. A suitable clamp circuit may be, for example, a Zener diode appropriately biased to clamp and limit the output of the amplifier 41.

A feedback resistor 45 is electrically connected between the output 41*b* of the amplifier 41 and the input terminal 42*a* of the electronic switch 42. The feedback resistor 45 in conjunction with an input resistance 46, an input resistance 47, an input resistance 48, and an input resistance 49, regulate and control the operation of the operational amplifier 41 in order that such amplifier forms an output signal $y'''(t)$ representing the initial condition amplitude sample in accordance with Equations (6) and (12).

An inverter 46*a* is electrically connected in a series circuit arrangement with the input resistor 46 in order that the algebraic sign of the amplitude sample $y_4$ from the converter C corresponds to the required sign set forth in Equation (6). For like reasons, an inverter 48*a* is electrically connected in a series electric circuit with the input resistor 48, to provide the correct algebraic sign for the amplitude sample $y_2$.

The resistance values of the feedback resistor 45 and the input resistors 46 through 49 are selected so that the ratio of their resistance values controls the gain of the amplifier 41 so that the amplifier 41 forms an initial condition signal amplitude in accordance with Equation (6) and Equation (12). Thus, the resistance values of input resistors 46 and 49 are equal to each other and are three times as great as the resistance values of input resistances 47 and 48. In this manner, the initial condition circuit 40 receives the amplitude samples from the converter C and forms an initial condition signal corresponding in amplitude to the third differential $y'''(t)$ of the output analog signal to be formed by the interpolator I in accordance with four successive amplitude samples from the converter C.

The first integrator circuit 50 receives the initial condition amplitude signal formed in the initial condition circuit 40 as has been previously set forth, and further receives amplitude samples from the converter C and integrates such signals received and forms an output signal $y''(t)$ in accordance with Equation (11). The first integrator circuit 50 includes an initial condition circuit forming an initial condition signal amplitude in accordance with Equations (7) and (15) including an operational amplifier 51 having a holding capacitor 53 and clamp circuit 54 of like structure and function to the capacitor 43 and circuit 44 of the initial condition circuit 40. An offset potentiometer 51*c* is connected with the operational amplifier 51 in order to adjust the gain and calibrate the output of the amplifier 51. The amplifier 51 forms the output signal and provides same at an output terminal 51*b* thereof in accordance with Equation (11) upon receipt at an input terminal 51*a* thereof of the output initial condition amplitude sample from the initial condition circuit 40 and the output amplitude samples from the converter C. An electronic switch 52 of like structure and function to the electronic switch 42 controls the application of the amplitude samples from the converter C to the amplifier 51.

A feedback resistor 55 and input resistors 56, 57 and 58 have their resistance values chosen in order to limit the gain of the operational amplifier 51 to form an initial condition signal, in a like manner to the formation of the initial signal in the initial condition circuit 40, in accordance with Equations (7) and (15).

The integrator circuit 50 further includes an integrator portion including an integrating feedback capacitor 150 electrically connected between the output 51*b* of the operational amplifier 51 and an input terminal 152*a* of a control switch 152 of like structure and function to the control switch 52. A surge limiting resistor 152d connects the switch 152 to ground and protects same against current surges during switching operations. An integrating resistance network 151 including a fixed resistance 151*a* and a calibration potentiometer 151*b* to adjust the gain of the integrator circuit 50 are electrically connected with the integrating capacitor 150 in order that the operational amplifier 51 integrates the input signal $y'''(t)$ upon receipt thereof from the initial condition circuit 40 and forms the output signal $y''(t)$ in accordance with Equation (11). An electronic switch 153 electrically grounds the signal received through the integrating resistance 151 upon receipt of the clock signal in order that the initial condition circuitry of the integrator circuit 50 may form the initial conditions in accordance with Equations (7) and (15) before each integrating operation cycle of the integrator circuit 50.

The second integrator circuit 60 receives an input signal $y''(t)$ from the first integrator circuit 50, as has been previously set forth, and further receives initial condition signals from the converter C in order to integrate the input signal $y''(t)$ and form therein an output signal $y'(t)$ in accordance with Equation (10). In the integrator circuit 60, an operational amplifier 61 receives an input signal from an initial condition portion of such integrator upon operation of a control switch 62 by the clock pulse signal from the data preparation circuit 11. The electronic switch 62 is of like structure and function to the switches 42 and 52 of the circuits 40 and 50, respectively. The operational amplifier 61 has an offset gain adjust potentiometer 61c, a holding capacitor 63 and a clamping circuit 64 of like structure and function to the circuitry of the initial condition circuit 40 and the first integrator 50.

A feedback resistor 65 of the integrator circuit 60 and input resistances 66, 67, 68, and 69 have resistance values chosen in order to form an initial condition amplitude signal for the integrator 60 in accordance with Equations (8) and (14).

A integrating portion of the integrator circuit 60 including an integrating feedback capacitor 160 and an integrating resistance network 161 including a fixed resistance 161a and a gain adjusting potentiometer 161b integrate the signal received from the first integrator 50 and process such signal together with the initial condition signal formed in the manner previously set forth in order to form an output signal $y'(t)$ in accordance with Equation (10).

As has been previously set forth with respect to the integrator circuit 50, control switches 162 and 163 control the application of the input signal $y''(t)$ to the operational amplifier 61 in order that the initial condition portion of the integrator circuit 60 may form the initial condition signal in accordance with Equations (8) and (14).

The third integrator circuit 70 receives the output of the second integrator circuit 60 and an initial condition signal $y_2$ in accordance with Equations (9) and (13) and forms an output signal $y(t)$ in accordance with Equation (1) by integrating the input signal so received.

An electronic switch 72 of like structure and function to the electronic switches in the circuitry previously set forth controls application of the initial condition signal to an input terminal 71a of an operational amplifier 71 in the integrator 70. The amplifier 71 has offset potentiometer 71c, holding capacitor 73, and clamping circuit 74 connected therewith in the same manner as the operational amplifiers 41, 51, and 61 previously set forth. A feedback resistor 75 and an input resistor 76 have the resistance values chosen in order to apply the amplitude sample from the converter C to the amplifier 71 to form an initial condition amplitude signal in accordance with Equation (9).

An integrating portion of the integrator circuit 70 including an integrator feedback capacitor 170 and integrator resistances 171 including a fixed resistor 171*a* and a gain adjusting potentiometer 171*b* integrate the output signal $y'(t)$ from the integrator 60 under control imposed by electronic switches 172 and 173. Thus, the integrator circuit 70 receives an input signal from the integrator 60, $y'(t)$, in accordance with Equation (10) and an initial condition signal from the converter C in accordance with Equation (9) and integrates such input signals forming an output signal $y'(t)$ in accordance with Equation (1).

Accordingly, the interpolator I forms the output analog signal $y(t)$ for intermediate values of the output analog signal between successive amplitude samples presented to the interpolator I by the converter C. The interpolation is performed in accordance with solution of a third order differential equation in order to form the third order polynomial function for the interpolation.

As has been previously set forth, the interpolation between successive amplitude samples from the converter C reduces transition between amplitude samples and accurately reconstructs the output analog signal in order to minimize transitions between output amplitude samples.

The foregoing disclosure and description of the invention are illustrative and explanatory thereof, and various changes in the size, shape, materials, components, circuit elements, wiring connections, and contacts, as well as in the details of the illustrated circuitry and construction may be made without departing from the spirit of the invention.

I claim:

1. An apparatus for accurate reconstruction of an output analog signal from a digital data signal comprising:

means for demultiplexing the incoming data stream corresponding to said digital data signal and retrieving therefrom clock voltage pulses representing the clock signal associated with said digital data signal;

serial to parallel converter means forming data words each composed of a plurality of successive digital bits from said digital data signal;

shift register means comprising $n + 1$ stages for storing successive digital data values of said digital data signal, said shift register means being driven by said clock voltage pulses whereby successive data values of said data signal are read into said shift register means;

digital to analog converter means for converting the plurality of digital values in said shift register means to a plurality of corresponding amplitude values, said amplitude values representing the output of said converter means;

analog storage means for storing the successive amplitude samples from said converter means, said analog storage means operable in synchronism with the serial data stream of said digital data signal by means of said clock voltage pulses; and output means for interpolating between the successive amplitude samples from said converter means in accordance with an $n^{th}$ order polynomial mathematical function $y(t)$ where $t$ is the time interval between successive amplitude samples, said output means comprising initial condition circuitry responsive to said clock pulses for generating signals representing successive derivatives of said digital data signal and integrator means receiving said derivative signals from the initial condition circuitry and driven by said clock pulses for integrating the output of said converter means to thereby form the output analog signal during the intervals between successive amplitude samples from said converter means whereby transitions between amplitude samples are minimized and the output analog signal is accurately reconstructed.

2. An apparatus for accurate reconstruction of an output analog signal from a digital data signal comprising:

means for retrieving from said digital data signal clock voltage pulses representing the clock signal associated with said digital data signal;

shift register means comprising n + 1 stages for storing successive digital data values of said digital data signal, said shift register means being driven by said clock voltage pulses whereby successive data values of said data signal are read into said shift register means;

digital to analog converter means for converting the plurality of digital values in said shift register means to a plurality of corresponding amplitude values;

analog storage means for storing the successive amplitude samples from said converter means, said analog storage means operable in synchronism with the serial data stream of said digital data signal by means of said clock voltage pulses; and output means for interpolating between the successive amplitude samples from said analog storage means in accordance with an $n^{th}$ order polynomial mathematical function $y(t)$ of the time interval $t$ between successive amplitude samples and thereby form the output analog signal wherein transitions between amplitude samples are minimized and the output analog signal is accurately reconstructed, said output means comprising integrator means for integrating the output of said converter means to form the output analog signal during the intervals between successive amplitude samples from said converter means; and means being responsive to said clock voltage pulses for computing initial conditions for said integrator means based upon $n + 1$ successive amplitude samples from said converter means, wherein said output means interpolates between successive output amplitude samples in accordance with said $n^{th}$ order polynomial function.

* * * * *